US012561502B2

(12) United States Patent
Liszewski et al.

(10) Patent No.:  US 12,561,502 B2
(45) Date of Patent:  Feb. 24, 2026

(54) FINITE STATE MACHINE VULNERABILITY AND PIPELINE ANALYSIS USING SATISFIABILITY MODELING

(71) Applicant: Battelle Memorial Institute, Columbus, OH (US)

(72) Inventors: Katie T. Liszewski, Powell, OH (US); Timothy A. McDonley, Grove City, OH (US)

(73) Assignee: Battelle Memorial Institute, Columbus, OH (US)

( * ) Notice: Subject to any disclaimer, the term of this patent is extended or adjusted under 35 U.S.C. 154(b) by 810 days.

(21) Appl. No.: 17/840,163

(22) Filed: Jun. 14, 2022

(65) Prior Publication Data

US 2022/0398367 A1      Dec. 15, 2022

Related U.S. Application Data

(60) Provisional application No. 63/210,333, filed on Jun. 14, 2021.

(51) Int. Cl.
G06F 30/33          (2020.01)

(52) U.S. Cl.
CPC .................................... G06F 30/33 (2020.01)

(58) Field of Classification Search
USPC ......................................................... 716/106
See application file for complete search history.

(56) References Cited

U.S. PATENT DOCUMENTS

| | | | |
|---|---|---|---|
| 2011/0246831 A1* | 10/2011 | Das ..................... | G06F 30/3323 |
| | | | 714/E11.029 |
| 2014/0040855 A1* | 2/2014 | Wang .................... | G06F 30/327 |
| | | | 717/107 |
| 2022/0398367 A1* | 12/2022 | Liszewski .............. | G06F 30/33 |

* cited by examiner

*Primary Examiner* — Mohammed Alam
(74) *Attorney, Agent, or Firm* — Grossman, Tucker, Perreault & Pfleger, PLLC; Edmund P. Pfleger

(57) ABSTRACT

The present disclosure provides a satisfiability modulo theory (SMT) modeling system that includes graphical representation circuitry to generate graphical data representing a circuit design; finite state machine (FSM) discovery circuitry to discover, based on a feedback loop of the circuit design, an FSM contained within the graphical data; SMT assertion generation circuitry to generate an SMT assertion set of the FSM, based on the combinatorial and/or sequential logic elements associated with the FSM; and SMT modeling circuitry to determine a behavior of the FSM by applying one or more logical functions to the SMT assertion set.

14 Claims, 19 Drawing Sheets

100

200

202

NODE
204

☆ ⬡ ◇ ◯ ◁ ⊚ ☐

(WIRE)
(AND)
(ALWAYS)
(INV)
(OR)
(OUTPUT)
(INPUT)

EDGE
206

(CLOCK)
(DATA IN)
(NULL)

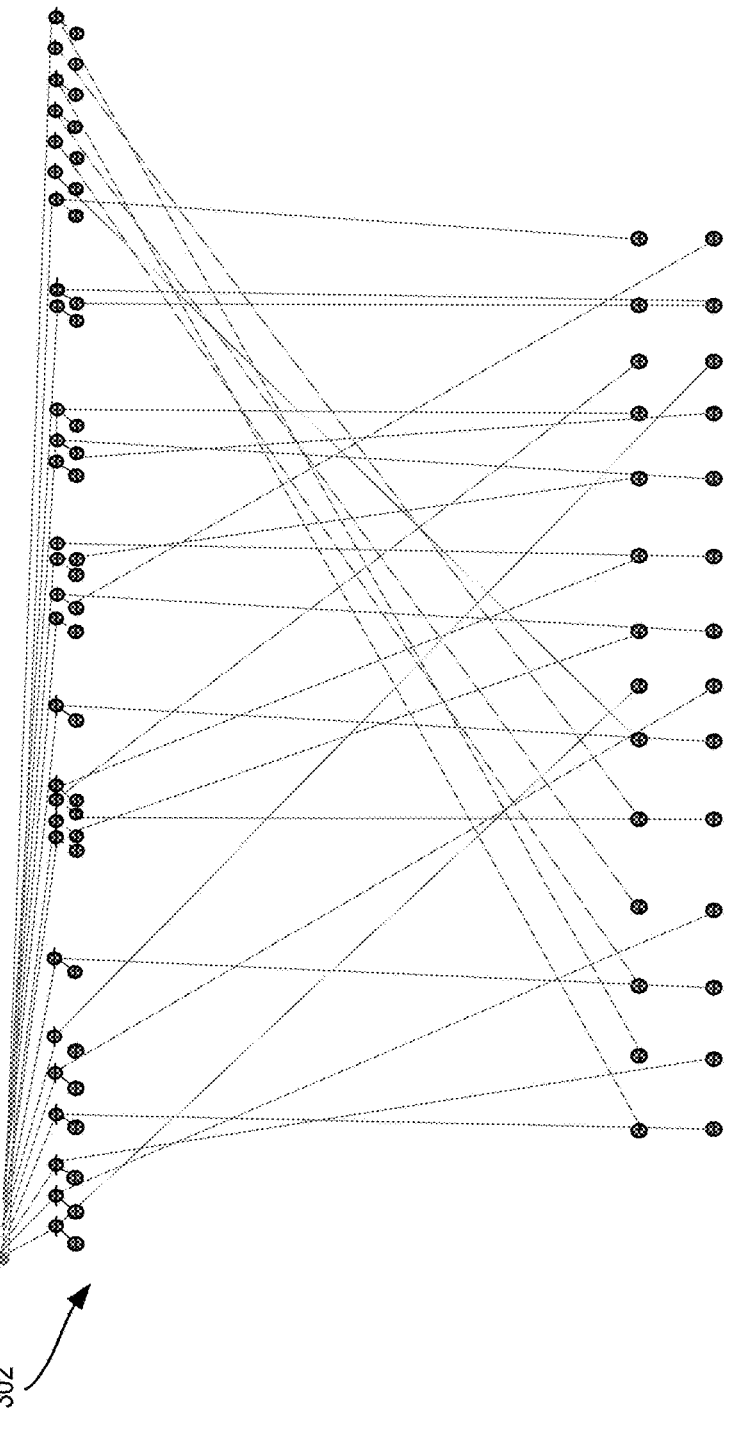
FIG. 3

400

DEPENDENT FFs FED BY
COMBINATIONAL LOGIC

406

402

TARGE FF

404

COMBINATIONAL LOGIC
THAT DEPENDS ON FF

1000A

1000B

1006

1004

1002

CONVERT TO Z3 ASSERTIONS ( BOOLEAN LOGIC EXPRESSIONS)

1106

[
FFB[3] == NOT (M8.DFFC3Q_REG),
FF[5] == M7.DFFS2Q_REG,
M8.L14 == NOT(OR (M8.L82, OR(M8.L82, OR(I[0],M8.L81)))),
FF[7] == M6.DFFGS.Q_REG,
M2.L119 == OR(FF[3], OR(FF[2], FFB[1])),
M2.L120 == OR(FF[10],FFB[2]),
M8.L12 == NOT(OR(M5.L134,M5.L109)),
M5.132 == NOT(OR(M5.L134, M5.L109)),
M1.DFFRP.Q_REG == M1.DFFRP.Q_REG,
M6.L131 ==
NOT(AND(M6.L129, AND(M6.L128, AND(BLINKB, M7.187))),
M7.L86 == AND(FFB[2], AND(FFB[1], AND(FF[0], M7.L87))),
M1.L118 == OR(FF[4], FFB[3],
FFB[8] == NOT(M1. DFFRP.Q_REG),
...
]

11A

1108

1500

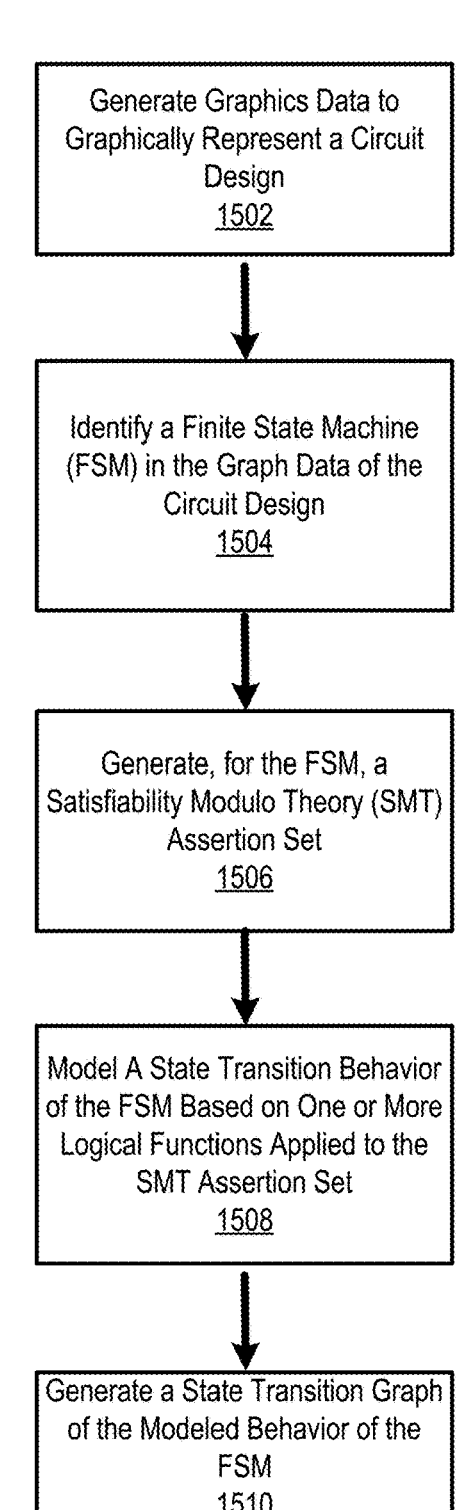

Generate Graphics Data to Graphically Represent a Circuit Design
1502

Identify a Finite State Machine (FSM) in the Graph Data of the Circuit Design
1504

Generate, for the FSM, a Satisfiability Modulo Theory (SMT) Assertion Set
1506

Model A State Transition Behavior of the FSM Based on One or More Logical Functions Applied to the SMT Assertion Set
1508

Generate a State Transition Graph of the Modeled Behavior of the FSM
1510

FIG. 15

1600
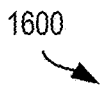
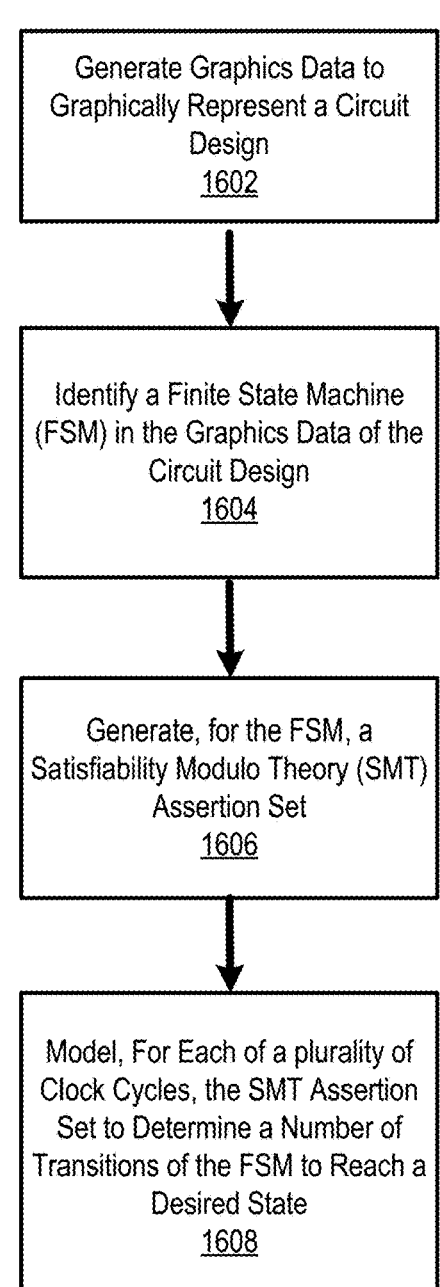
Generate Graphics Data to Graphically Represent a Circuit Design
1602
Identify a Finite State Machine (FSM) in the Graphics Data of the Circuit Design
1604
Generate, for the FSM, a Satisfiability Modulo Theory (SMT) Assertion Set
1606
Model, For Each of a plurality of Clock Cycles, the SMT Assertion Set to Determine a Number of Transitions of the FSM to Reach a Desired State
1608
FIG. 16

FINITE STATE MACHINE VULNERABILITY AND PIPELINE ANALYSIS USING SATISFIABILITY MODELING

This application claims the benefit of U.S. Provisional Application Ser. No. 63/210,333, filed Jun. 14, 2021, which is hereby incorporated by reference in its entirety.

TECHNICAL FIELD

The present disclosure relates to finite state machine vulnerability and pipeline analysis using satisfiability modeling.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIGS. 2-11 illustrate operations of graph-based circuit representation circuitry, FSM discovery circuitry 104 and SMT assertion generation circuitry in connection with a text-based circuit design file;

FIG. 15 illustrates a flowchart of SMT modeling operations of a finite state machine (FSM); and FIG. 16 illustrates a flowchart of pipeline modeling operations of a finite state machine (FSM).

Figure 1:
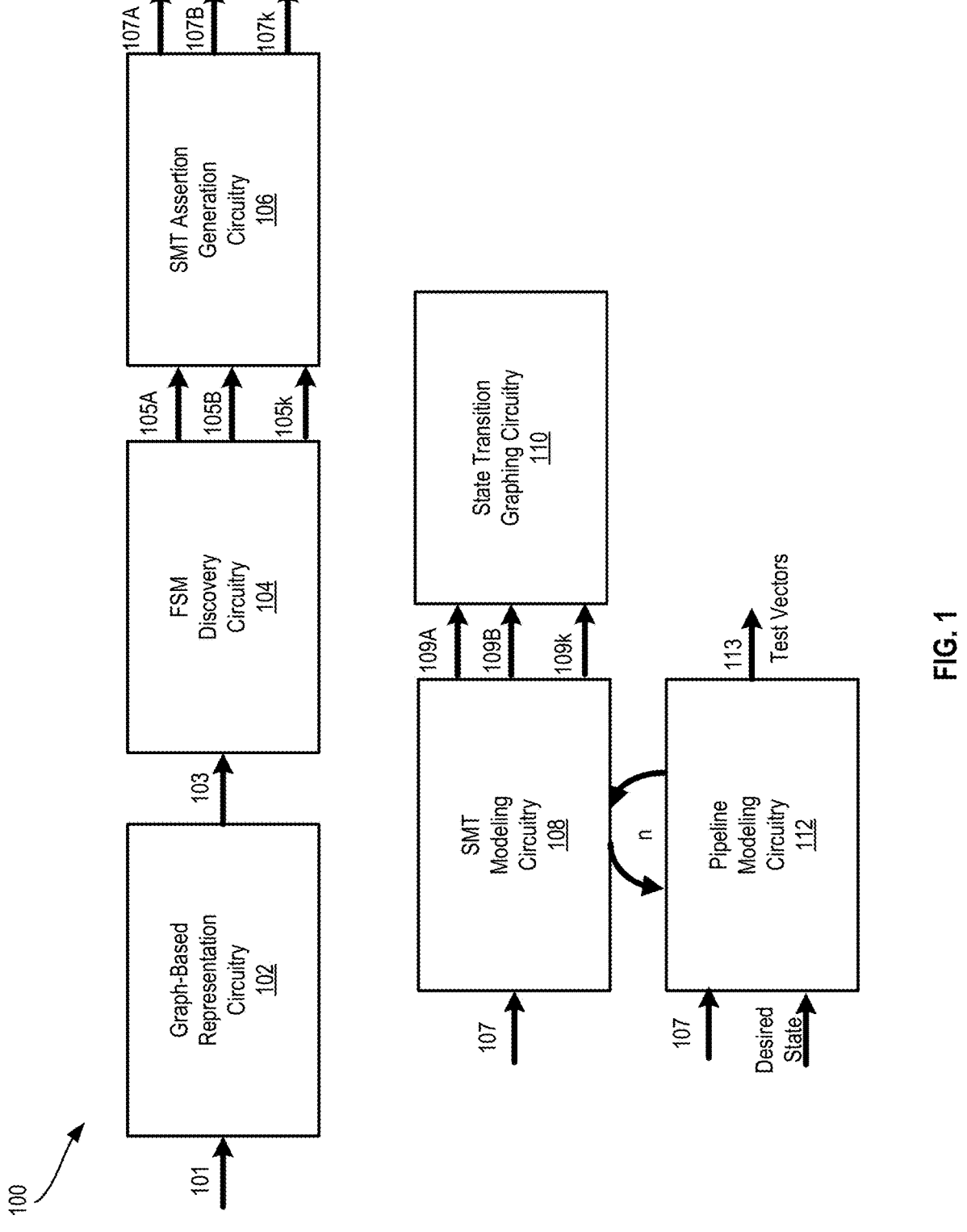
FIG. 1 illustrates an SMT modeling system according to several embodiments of the present disclosure.

Although the following Detailed Description will proceed with reference being made to illustrative embodiments, many alternatives, modifications and variations thereof will be apparent to those skilled in the art.

DETAILED DESCRIPTION

This disclosure provides vulnerability analysis of a finite state machine (FSM) using satisfiability modulo theory (SMT) techniques. In embodiments described herein, combinational and sequential logic, relevant to an FSM, are converted into an SMT model. The model is then used to perform analysis on the state transitions. In some embodiments, the FSM model generates a graph representation of state and state transitions of an FSM, thus allowing for graph based algorithms to be leveraged in conjunction with the SMT model for analysis. As is known, functional/behavioral simulation of a circuit design may not be able to fully map the state transitions of a FSM. Furthermore, conventional analysis depends on knowledge of the design and a set of test vectors included in a testbench. The modeling described herein for an FSM model provides more efficient and wider coverage algorithmic analysis techniques through SMT modeling and graph theory. Unreachable state transitions, recoverable and irrecoverable loops can be discovered and mapped out without the need for predefined test vectors and prior knowledge. Vulnerabilities in the device related to states and state transitions that are described in the hardware, unknown/untested by the designer, are more efficiently and effectively handled with SMT modeling and graph theory techniques. Use of SMT modeling and graph theory to discover unknown and/or illegal state transitions that result in vulnerabilities in the device. SMT modeling and graph theory can find and semi-automatically explore unintended/illegal states and state transitions more easily than traditional functional/behavioral simulation with a testbench and pre-design test vectors.

This disclosure also provides pipeline analysis of a finite state machine (FSM) using satisfiability modulo theory (SMT) techniques. In embodiments described herein, combinational and sequential logic of a design are converted into a set of assertions in an SMT solver. The assertions are built in a way to allow for the modeling of information/logic flow through the design across n number of clock cycles. A set of assertions and or rules can then be applied to the model in order to check satisfiability and determine properties/behaviors of the device. SMT based solvers, such as Z3, provide an efficient way to trace n transitions to a desired state. Each state and corresponding feedback/output combinational logic is modeled for every clock cycle within the n clock cycles. The SMT solver is the able to reason across the logic assertions that span several clock cycles and efficiently find solutions when provided a desired end state or set of states across clock cycles. This methodology can efficiently determine if the system state is reachable. It is also capable of finding a path to FSM activation state and recover the key in an FSM that contains obfuscated or locked functionality. The SMT model also allows for an efficient way of performing Rules/Assertion checking applicable to a wide variety of applications including to discover/check pipeline-based vulnerabilities. Modeling the states and logic of a device across multiple clock cycles allows an SMT solver to provide a platform for analysis that is more efficient at solving these problems than formal verification and design testing.

FIG. 1 illustrates an SMT modeling system 100 according to several embodiments of the present disclosure. The system 100 includes graph-based representation circuitry 102 generally configured to extract information from a text-based circuit design file 101 (e.g., Verilog netlist file, etc.) and generate a graphical representation of the circuit design. In the context of a logic circuit design, a netlist (or other text-based circuit design file) generally includes logic elements (e.g., AND, OR, NOT, NAND, NOR, etc.) and interconnections (e.g., wire connections) of a circuit design in a text-based format. The logic elements may form combinatorial logic sub-circuits (e.g., output is a function of present state only) and/or sequential logic sub-circuits that specify feedback from output to input (e.g., output depends on the present value of inputs and a past input (e.g., flip-flop (memory) elements)). The netlist may also include physical properties of logic elements (e.g., electrical characteristics, definitions, etc.) and/or interconnections.

Being a text-based circuit description, the layout and design of circuit properties, particularly the identity of finite state machine (FSM) sub-circuits, are not readily apparent by neither human inspection of a netlist file nor by machine-based extraction tools. Accordingly, the graphical representation circuitry 102 is configured to generate a graphical representation of a circuit design file to enable extraction of FSM sub-circuits within a circuit design. An FSM, as is understood, generally includes logic elements that include feedback information from an output to an input (i.e., sequential logic). The graphical representation circuitry 102 may generate graph-based data 103. The graph-based data 103 may comply, or be compatible with, conventional and/or proprietary circuit graphing formats, for example, a NetworkX graph, and/or other circuit graphing extraction formats.

The system 100 also includes FSM discovery circuitry 104 generally configured to parse the graph file data to discovery and identify one or more FSMs associated with the logic circuit. The FSM discovery circuitry 104 is configured to identify feedback loops in the circuit design. Such feedback loops and generally include logic elements and/or a collection of logic elements, in combinatorial and/or sequential logic layout, that specify an output being fed back into an input. Such feedback loops generally define an FSM sub-circuit, since an operational state of the FSM sub-circuit may take on values that are based on both current and previous inputs. (Feedback loops, as used herein, may include feedback loops, feed forward loops mealy moore, directed logic cycle in a logic graph, etc.) The FSM discovery circuitry 104 identified FSMs 105A, 105B, . . . , 105k identified in the circuit design.

The system 103 also includes SMT assertion generation circuitry 106 generally configured to generate a satisfiability assertion set for a given FSM identified by the FSM discovery circuitry 104. A satisfiability (e.g., a satisfiability modulo theory (SMT)) assertion set is generally defined as Boolean statement equations regarding the logic circuit structure of an FSM (e.g., rule sets based on intended operation/design of an FSM, generic operational parameters for each FSM, relationships regarding states and/or data flow, etc.). In some embodiments, the SMT assertion generation circuitry 106 is configured to convert logic gates into Boolean equations based on, for example, input(s), output(s), output gate functions, current state information, etc. In addition to logic gates, converts synchronous/asynchronous control inputs on sequential elements (e.g., flip-flops, latches, etc.) of the FSM into Boolean statement equations. An SMT assertion may include, for example, state flip-flops, control flip-flops, current state, current control, outputs, etc. The SMT assertion generation circuitry 106 is also configured to generate a plurality of SMT assertion sets 107A, 107B, . . . , 107k, for example, for each FSM identified in the circuit design. Each SMT assertion set 107A, 107B, . . . , 107k may include the SMT assertions (described above) and/or user-defined assertions.

The system 100 also includes SMT modeling circuitry 108 generally configured to model the SMT assertion sets 107 to determine a behavior of a given FSM. In some embodiments, the SMT modeling circuitry 108 analyzes the behavior of an FSM by cycling through several transition states. In addition, the SMT modeling circuitry 108 may be configured to execute a plurality of external logic functions that may be germane to a given FSM, for example, set state, set control, reset state, get next step, step, sensitivity between states, set/reset/enable, etc., to simulate the behavior of a given FSM. Such operations may enable, for example, the discovery of legal transition loops, illegal and/or locked transition loops, etc. In addition, the SMT modeling circuitry may enable users to dynamically interact with a circuit design in a robust manner by investigating transition states of an FSM. The SMT modeling circuitry 108 may comply with conventional and/or proprietary modeling tools such as Z3 Solver, etc. The SMT modeling circuitry 108 may generate a plurality of state outputs 109A, 109B, . . . , 109k that includes information regarding the state of a given FSM for a given transition state input.

The system 100 may also include state transition graphing circuitry 110 generally configured to generate a state transition graph based on a state output 109A, 109B, . . . , 109n for a given FSM. A state transition graph may enable a user to employ graph theory techniques to provide deeper analysis of a given FSM, etc.

The system 100 also includes pipeline modeling circuitry 112 generally configured to generate a plurality of state outputs at each of a selected number (n) of clock cycles for a given FSM. The pipeline modeling circuitry 112 is configured to trace the number of transitions required to reach a desired state, based on a desired state and/or desired relationship between states and one or more of the SMT assertion sets 107A, 107B, . . . , 107k. In operation, the pipeline modeling circuitry 112 combines the SMT modeling circuitry across (n) number of state transitions to constrain the behavior of the FSM at each state. In addition, the pipeline modeling circuitry 112 is configured to determine if a desired state is reachable (or reachable within a fixed number of clock cycles), based on a desired state input and one or more of the SMT assertion sets 107A, 107B, . . . , 107k. In some embodiments, a maximum number of clock cycles value may be selected to determine if a desired state can be reached within the maximum number of clock cycles. In addition, the pipeline modeling circuitry 112 may be configured to determine a path to activate a given FSM and/or recover a given FSM from an illegal/invalid state, based on a desired state and one or more of the SMT assertion sets 107A, 107B, . . . , 107k. The pipeline modeling circuitry 112 may generate a pipeline status output 113, which may include state information of the FSM for each clock cycle evaluated. Such state information for each clock cycle and/or selected clock cycles may, in turn, be used as one or more test vectors of the circuit design, for example to test the circuit design at a given clock cycle and/or sequence of clock cycles.

Figure 2:
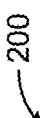

FIGS. 2-11 illustrate operations of the graph-based circuit representation circuitry 102, the FSM discovery circuitry 104 and the SMT assertion generation circuitry 106 in connection with a text-based circuit design file (e.g., Verilog file), etc.) used as an input 101, according to one embodiment of the present disclosure. FIG. 2 illustrates an example logic graph 200 for a circuit design. The illustrated graph 200 depicts a plurality of nodes 202 coupled together via logical and/or physical connections (e.g, data/wire connections, etc.). As shown at 204, a node can include a wire, logic gates (e.g., inverter, AND, OR, etc.) logic function (e.g., always, etc.) output and input. An edge 206 can include physical connections, null, clock, data in, etc. Typically, an edge is a physical connection. An edge may have properties such as, for example, what port it is connected to, the general use for the signal traveling through the edge (such as clock, data-in, data-out, reset, etc.). Edges can be thought of as wires or conductors in the circuit. A node of type 'wire' is a junction between one or more incoming edges and one or more outgoing edges.

Figure 4:
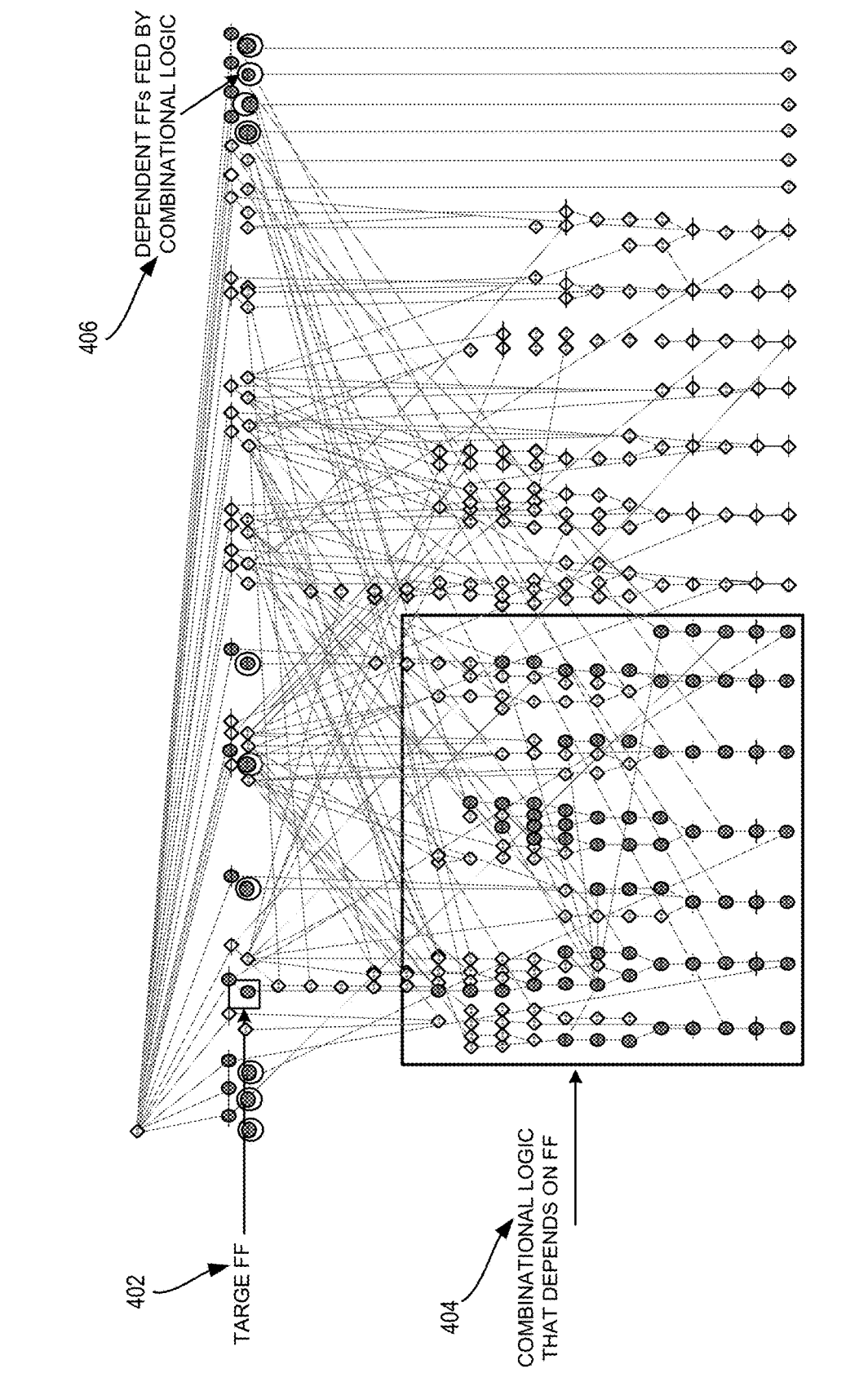
Figure 5:
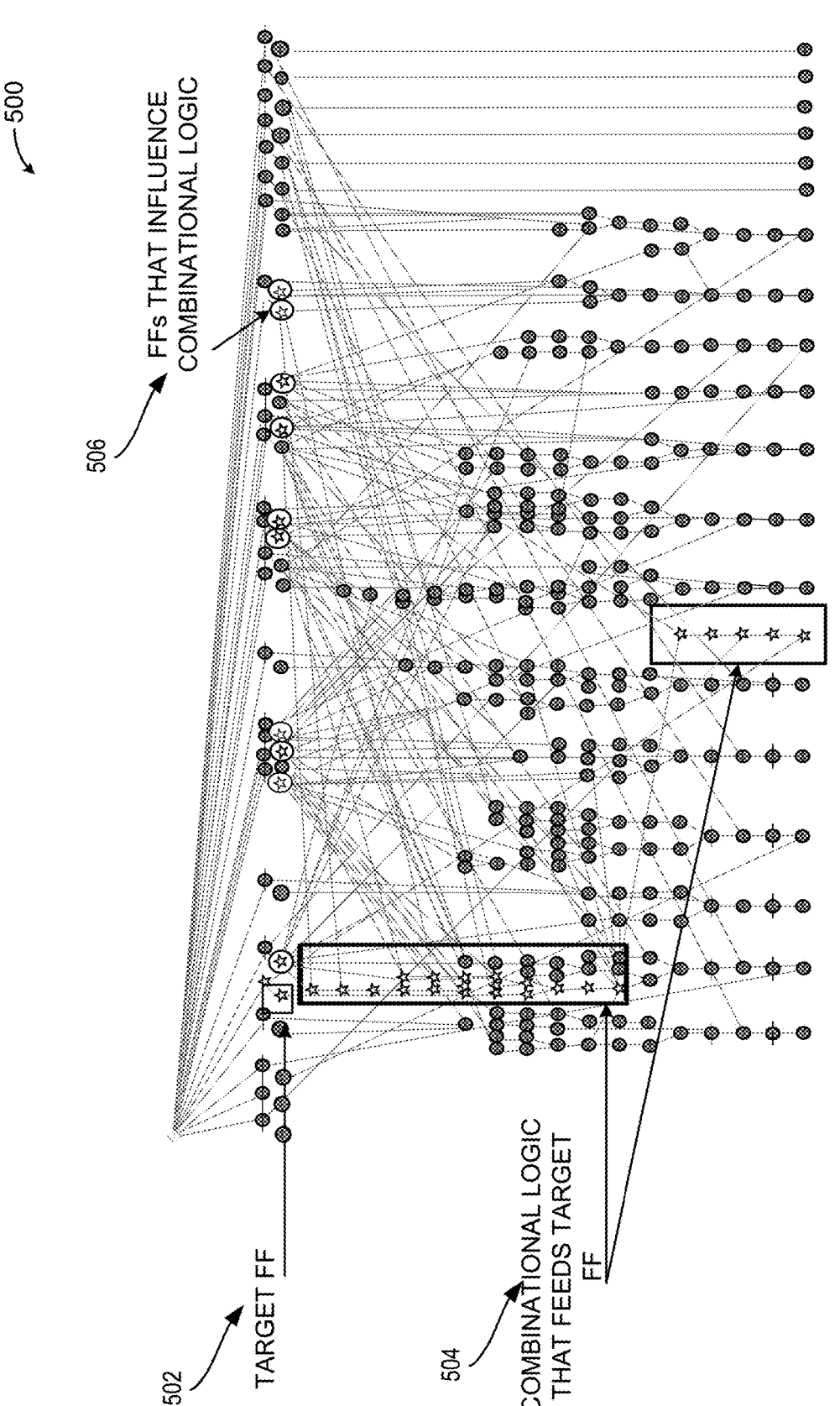

FIGS. 3-11 illustrate operations for identifying a target FSM within the circuit design file as illustrated in graph form in FIG. 2. FIG. 3 illustrates an example initial process 300 for identifying an FSM. In this example, the FSM 302 is identified based on one more selected user-selected characteristics, for example, common clock, common ancestor as reset, set enable, etc., type and/or number of control lines, type of flip-flop (FF), etc. In this example, for each flip-flop initially identified as being associated with the FSM 302, such a FF may be further analyzed to determine one or more circuit components that influence and/or depend from the FF circuit, as described below. FIG. 4 illustrates an example circuit graph 400 in which circuit elements that depend on a target flip-flop are identified. In this example, the target FF is 402. Combinational logic that depends on the target FF 402 is shown at 404. In addition, FFs that are fed by the dependent combinational logic 404 are shown at 406 (all the circled nodes). Thus, an output from target FF 402 is an input, either directly or indirectly through combinational logic 404, to dependent FFs 406. Dependency of the combinational logic elements 404 on FF 402 may be determined by the inputs and outputs of the FF 402 and the combinational logic elements 406, such that combinational logic elements whose state depends on one or more direct or indirect inputs and/or outputs from the FF 402 are identified as be that dependent upon FF. FIG. 5 illustrates an example circuit graph 500 in which circuit elements that influence a target flip-flop are identified. In this example, the target FF is 502. Combinational logic circuit elements that feed the target FF 502 are shown at 504. In addition, FF circuits that influence the combinational logic 504 and target FF 502 are shown at 506 (all the circled nodes). Thus, inputs to the target FF 502 are fed directly or indirectly through combinational logic 504, from influencer FFs 506. Influence of the FFs 506 on the combinational logic elements 504 may be determined by the inputs and outputs of the target FF 502 and the combinational logic elements 506.

Figure 6:
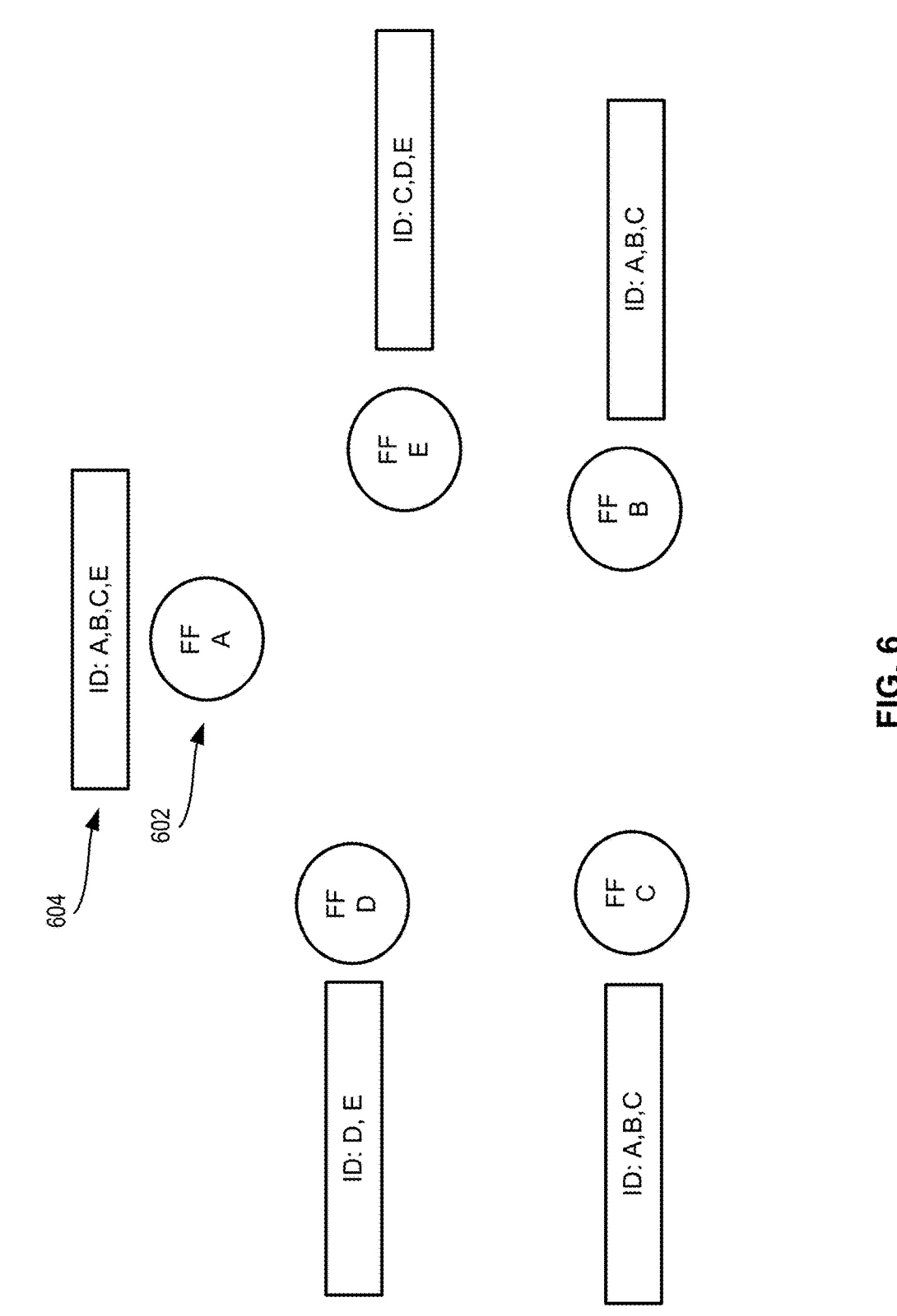
Figure 7:
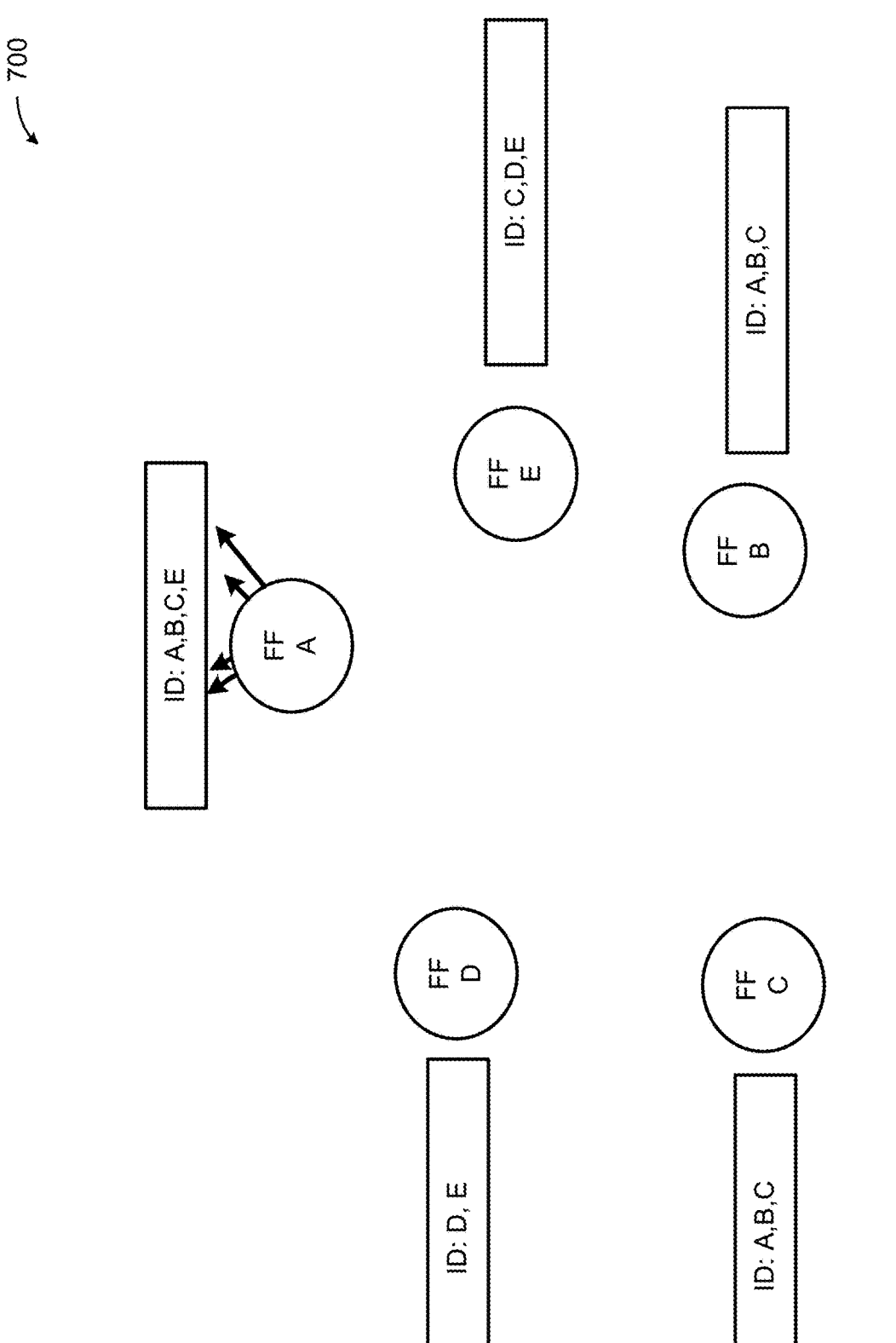
Figure 8:
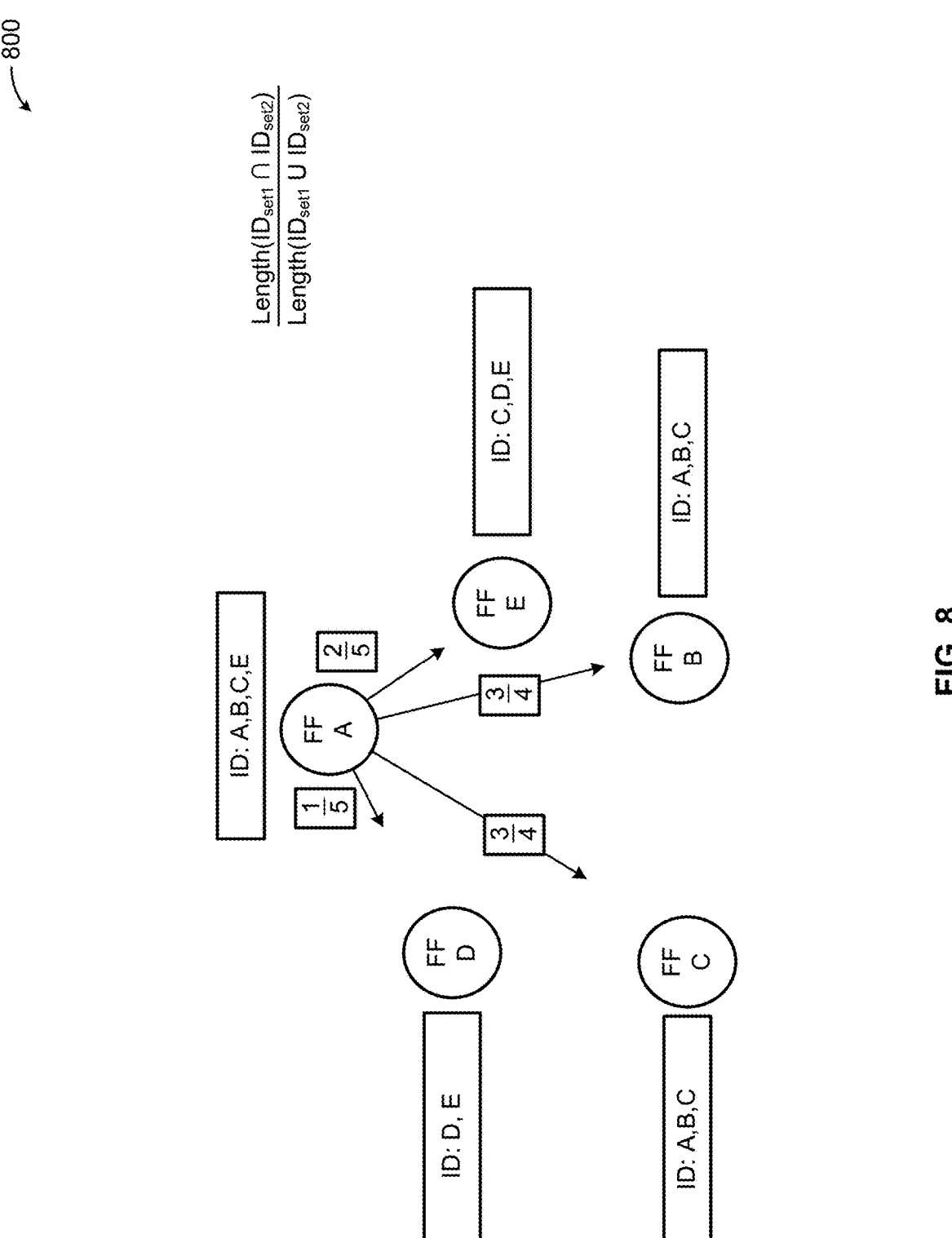
Figure 9:
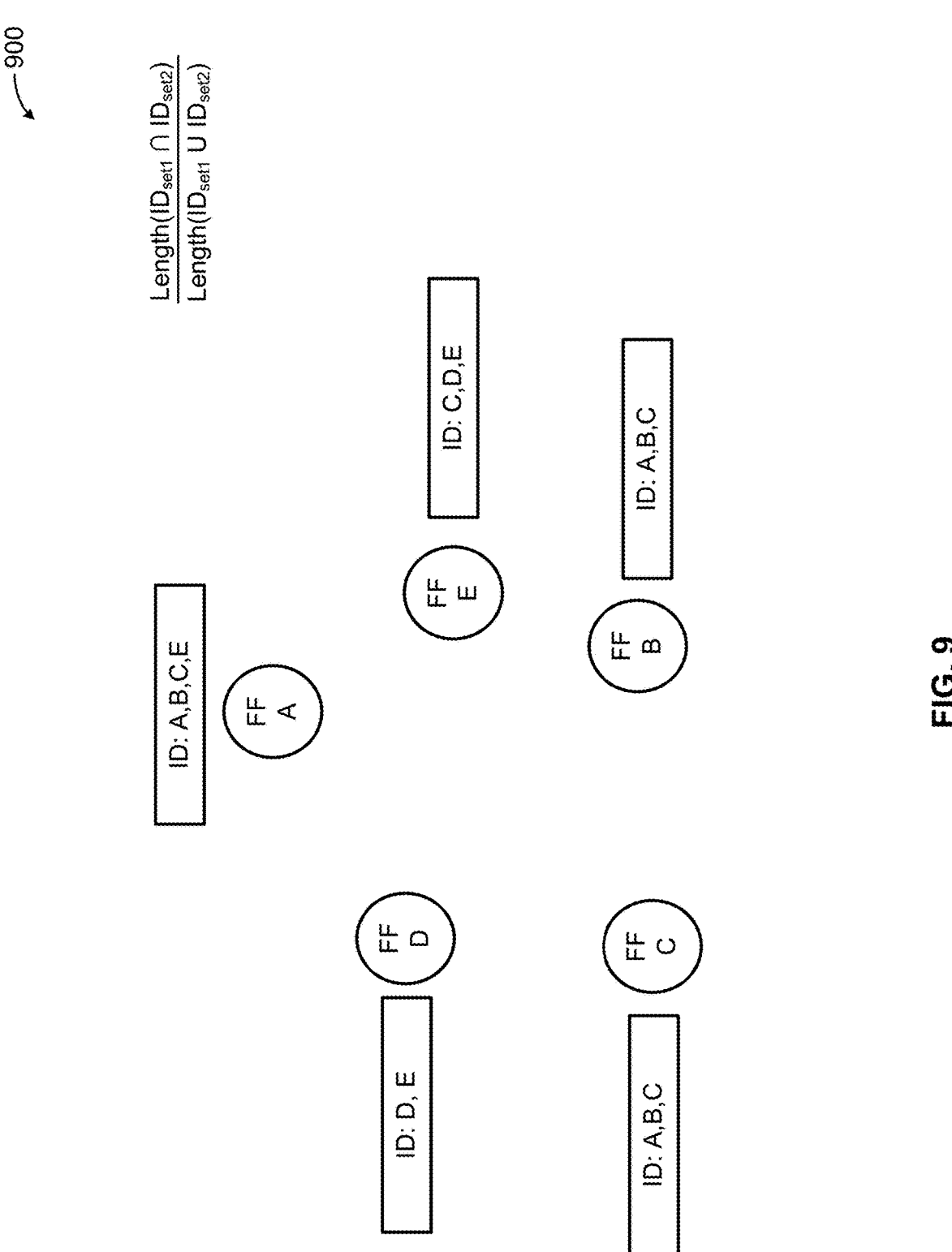

FIGS. 6-9 illustrate operations of forming influence/dependency (ID) sets and association strength scores for each FF of the circuit graph. The operations of FIGS. 6-9 may enable the use of a force-directed algorithm (e.g., known force-directed algorithms such as ForceAtlas 2 (FS2), and/or custom and/or proprietary force-directed algorithms) to group FFs into one or more FSMs. FIG. 6 illustrates an ID sets 600 for target FFs A, B, C, D and E (where target FFs A, B, C, D and E may be any of the FF circuits identified in the previous graphs. For example, FF A 602 has an ID set 604, where ID set 604 specifies that FF A is dependent upon and/or influenced by FFs A, B, C and E. The force-directed algorithm (e.g., FS2) may initially bias all nodes to "repel" one another (i.e., nodes are not associated by other circuit elements, including ID FF identified above). This concept is illustrated in FIG. 7, where FF A FF nodes repels all other FFs (including the FF in the ID set). To determine an "attraction strength" for each pair of nodes, an association strength score between node pairs may be determined. This is illustrated in FIG. 8. An association strength score is determined for each pair of nodes (FFs) based on how similar their respective ID sets are. The larger the strength score means a greater "attraction" between the pair of nodes. For example, FF A has an ID set (A, B, C, E) and FF B has an ID set (A,B,C). The association strength score between FF A and FF B is determined by intersection and union of their ID sets. Specifically, the strength score is (intersection of ID set A and ID set B/union of ID set A and ID set B). In this example, the association strength score between FF A and FF B is ¾. Compared to, for example, the association strength score of ⅕ between FF A and FF D. These concepts are repeated in FIG. 9.

Figure 10A:
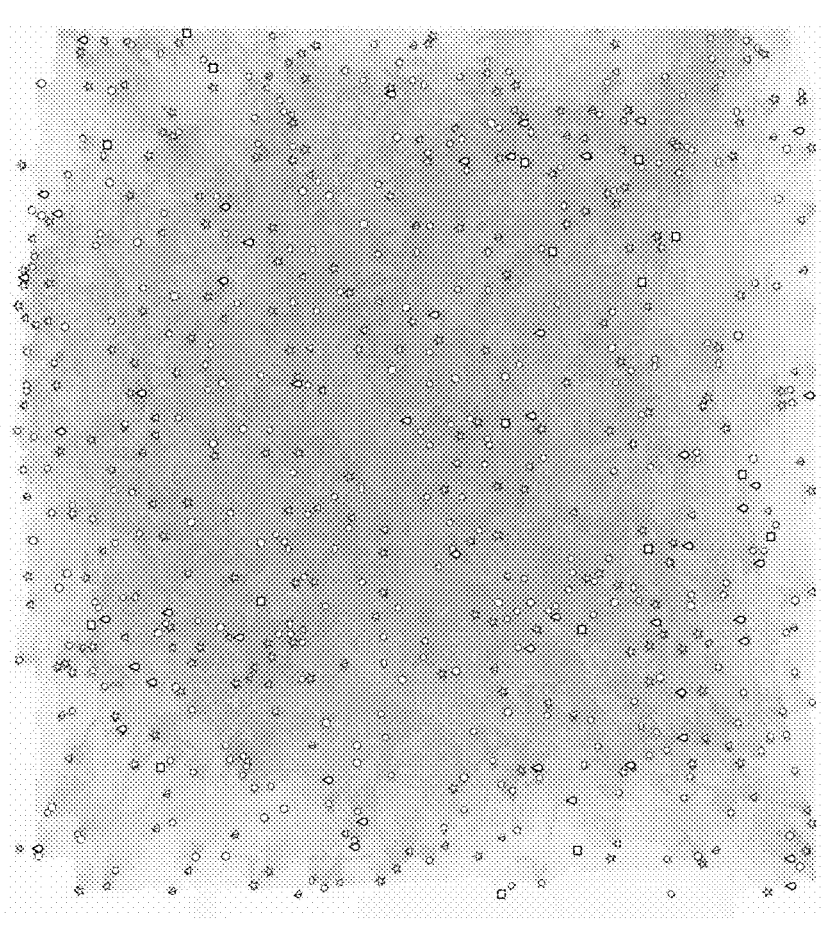
Figure 10B:
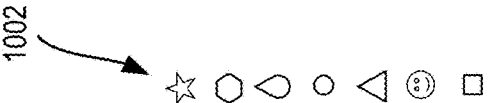

FIGS. 10A and 10B illustrate the nodes of the circuit graph and application of a force-directed algorithm to the nodes of the circuit graph based on the association strength score (described above) to identify one or more FSMs. FIG. 10A illustrates a cluster graph 1000A representing the circuit nodes arranged in random and/or selected placement. FIG. 10B illustrates the cluster graph after application of a force-directed algorithm to the nodes 1000B. The FSMs are identified by the node shapes 1002. Cluster 1004 may be considered a tightly-packed cluster, indicating a high degree of confidence that each node in the cluster 1004 is a member of the same FSM. Cluster 1006 may be considered a loosely-packed (distributed) cluster, indicating a low degree of confidence that all of the nodes in cluster 1006 are associated with the same FSM. A loosely packed cluster may need to be analyzed further (e.g., changing initial assumptions as described in FIG. 3) to determine if changed assumptions may generate a more tightly packed cluster.

Figure 11A:
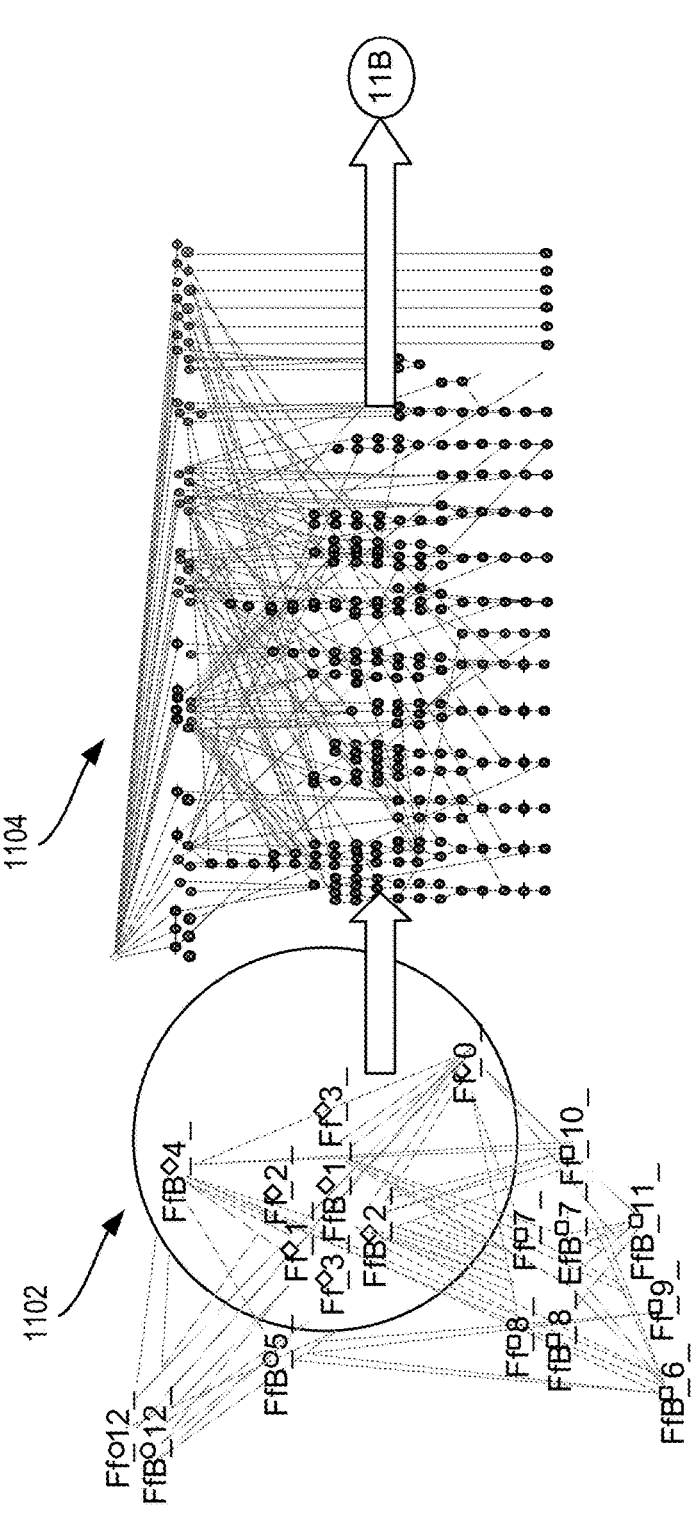
Figure 11B:
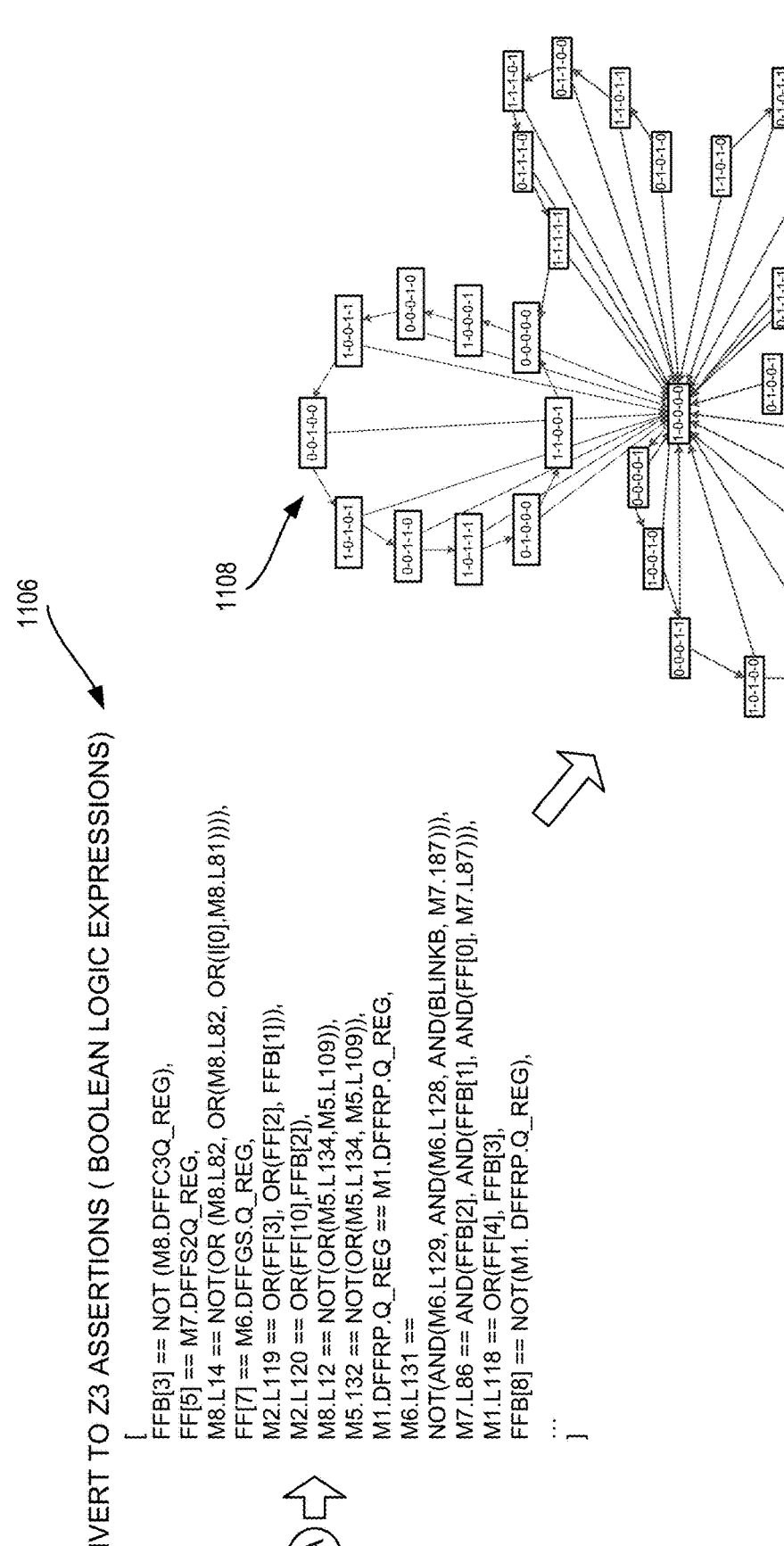

Once an FSM is identified, as described above, one or more FSM assertion sets may be generated. FIG. 11A circuit graphs 1100A which may be obtained for a given FSM. For example, a cluster graph 1102 may be generated after determining an FSM using a force-directed algorithm (described above). In addition, an extracted feedback graph 1104 may be generated. FIG. 11B illustrates an example assertion set 1106 and state transition graph 1108 which may be generated as described herein.

Figure 12A:
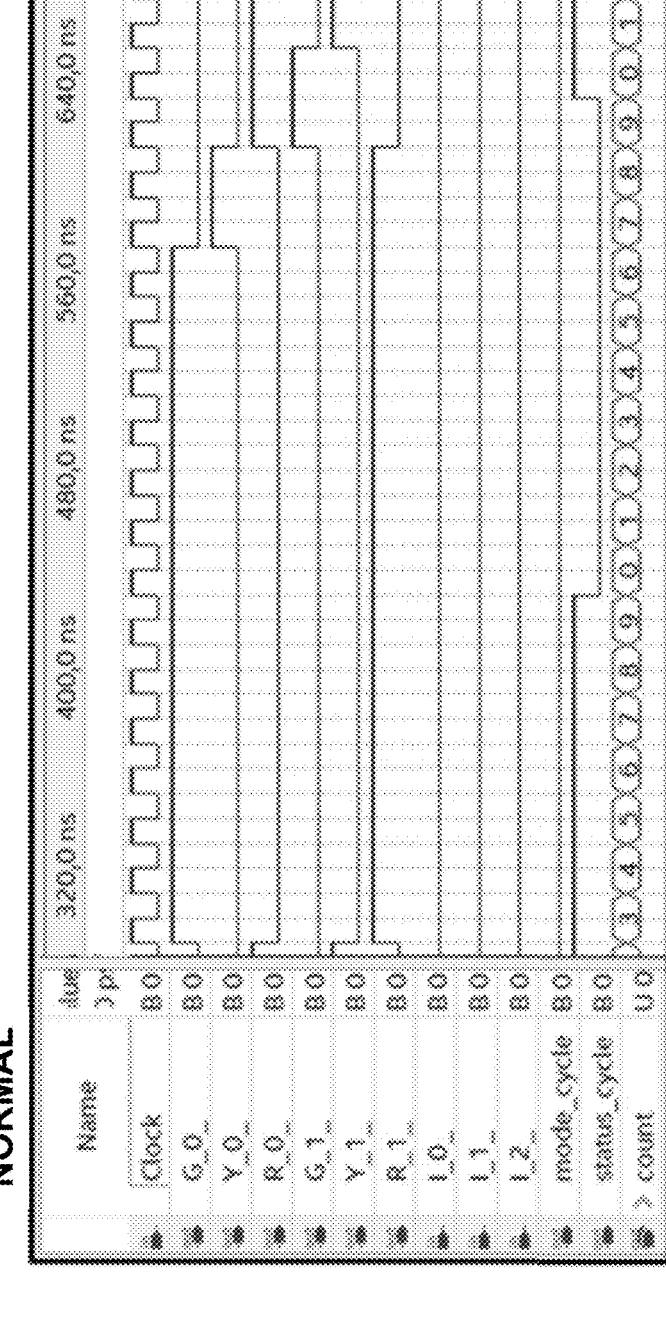
FIGS. 12-14 illustrate the operations of SMT modelling circuitry, pipeline modeling circuitry and the state transition graphing circuitry.
Figure 12B:
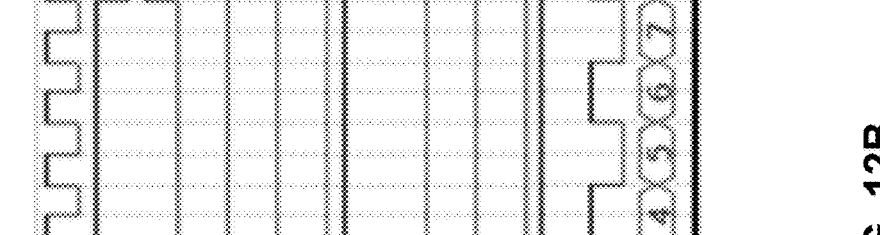
Figure 13:
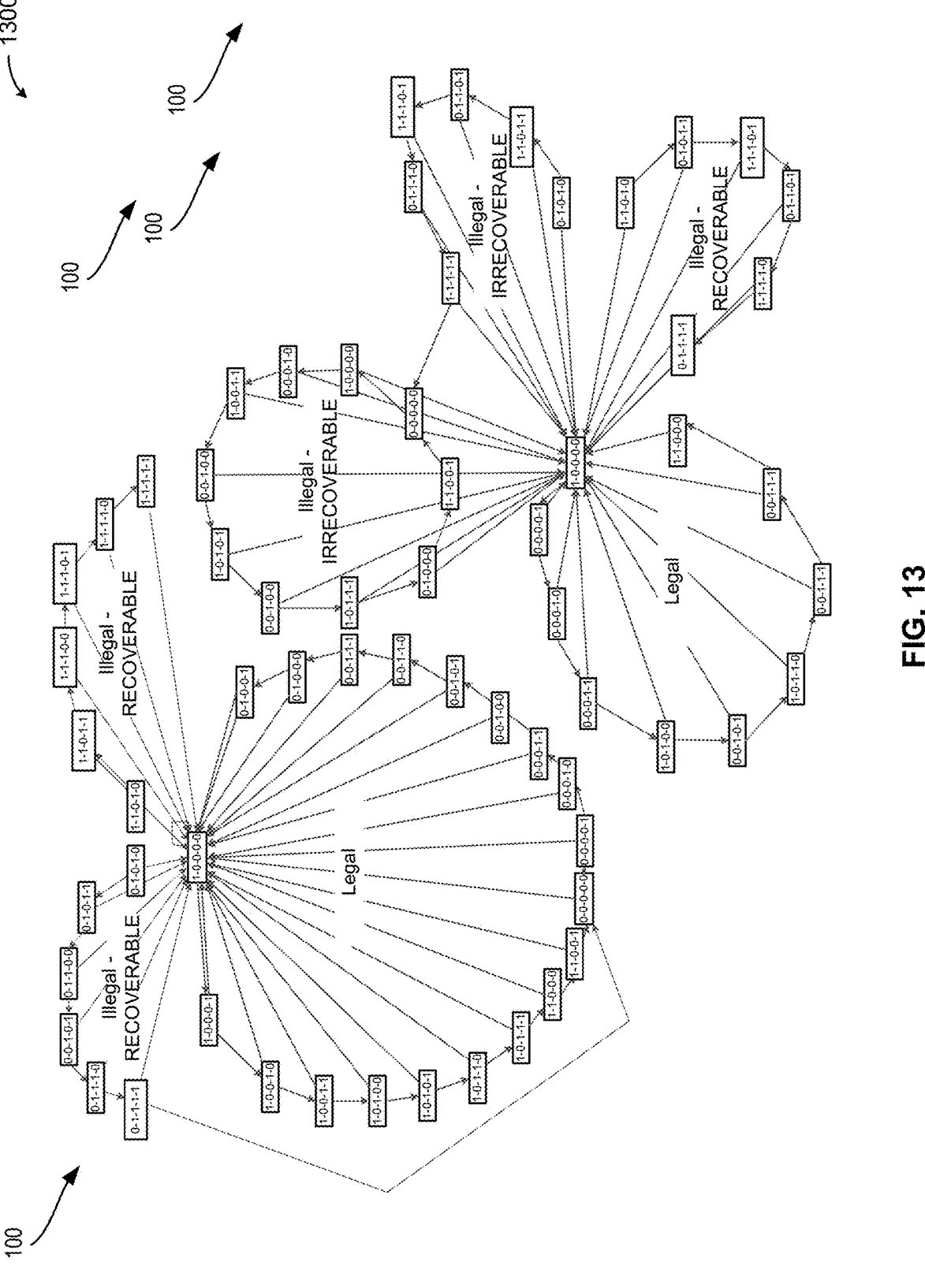
Figure 14:
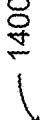

FIGS. 12-14 illustrate the operations of the SMT modelling circuitry 108, pipeline modeling circuitry 112 and the state transition graphing circuitry 110. FIGS. 12-22 illustrate example circuit of a traffic light controller that includes a modulo 10 counter that outputs 4-bit unsigned binary. A traffic light controller may be subject to single event upsets (SEUs) that can cause dangerous traffic patterns, and cannot be recovered from until the controller is reset manually. The effects of synthesis using standard settings for both an ASIC and FPGA workflow on the FSM associated with a traffic light controller are detailed below.

The FSM is extracted from a circuit design netlist (e.g., ISCAS-89 S298 netlist) using the FSM discovery circuitry 104. The FSM discovery circuitry 104 provides an automated means for identifying potential state registers, locating all relevant feedback and control logic, and extracting a target FSM, even in a flattened post-synthesis netlist. The extraction produces an SMT based model of the FSM. This model, which is restricted to FSM standard cells, allows for efficient exploration of the FSM state space, including satisfiability across multiple clock cycles and automated test bench generation.

While traditional simulation and verification tools do offer methods to corrupt an FSM and explore behavior after an SEU, they represent a considerable investment of time and effort to use. The FSM model extracted by the FSM modelling circuitry 108 and pipeline modelling circuitry 112 offer ways of interacting with the FSM not possible with traditional simulation techniques through SMT solver techniques. For instance, a designer may need to confirm that there is no possible path to a specific state, including through a SEU. The pipeline modelling circuitry 112 which includes an SMT solver-based model of the FSM provides a means for modeling this assertion over multiple clock cycles. The satisfiability of the assertion can be checked without having to simulate the FSM on every possible state transition. The FSM model will either return that the state is unreachable or provide an example set of state transitions and control inputs to reach the specified state (not necessarily a unique solution). In this way the designer is essentially running the state transitions in reverse, starting at the problem state, determining if the issue exists and if so, working backwards into one of many known states. Conversely, traditional simulation would need to create a test bench with full coverage, including modeling SUEs, to definitively know that a state is unreachable. This is of great importance as an FSM can become so large that simulation of the entire state space becomes computationally untenable.

State Transition Graphs (STGs), as generated by the state transition graphing circuitry 110, are described below. The traffic light controller directs two directions of traffic, named primary and secondary. For the primary lane, the sequence is 14 clock cycles of green, 2 clock cycles of yellow, and 4 clock cycles of red. For the secondary lane, the sequence is 16 clock cycles of red, 2 clock cycles of green, and 2 clock cycles of yellow. This is illustrated in the timing diagram 1200A of FIG. 12A. The device also includes a faster cycle mode, illustrated in the timing diagram 1200B of FIG. 12B. For the primary lane, the fast sequence is 6 clock cycles of green, 2 clock cycles of yellow, and 2 clock cycles of red. For the secondary lane, the fast sequence is 8 clock cycles of red, 1 clock cycles of green, and 1 clock cycles of yellow.

The timing of the cycles is done with the Counter module, a modulo 10 counter, and the status_cycle register. The status_cycle register keeps track of the first half and second half of the 20 stage cycle in conjunction with the counter's 10 states. In the fast mode operation, which is only 10 cycles, the status_cycle register is logic high on even counter states and low on odd states.

Extraction of the FSM from the original netlist is done automatically with the FSM discovery circuitry 104 using a force-directed clustering, as described above. The FSM for the traffic light controller includes the four bits of the counter grouped together with the status_cycle register. The feedback logic from the group is extracted and used to generate the state transition graph (STG) 1300 shown in FIG. 13.

The STG 1300 includes legal states, as defined by the design specifications, and result in proper device operation. The STG 1300 also illustrates illegal states, which, in this example, represent counter values between 10-15. These illegal transitions cause unexpected behavior of the circuit, as described below. Recoverable loops are illegal transitions that lead back to normal device operation after a number of clock cycles.

Irrecoverable loops are illegal transitions that do not return to normal device operation without a manual reset signal. Note that for this device there is no deadlock; a state that can be reached, but not exited from. The irrecoverable loops are given by the status_cycle register getting out of sync from the counter and having the wrong even/odd relationship.

The STG and illegal states can be used to understand how SEUs might affect the device as a whole. FIG. 14 illustrates a timing diagram 1400 of an example illegal state. In this example, a SEU puts the device into an irrecoverable loop of illegal states. The state transitions and associated control values are used to generate a test bench to drive the design and determine effects. When the device is in the fast cycle, a SEU can move the state from 2 to 10. The STG shows that the counter will continue to 15 before returning to 0, and it will not recover because the status_cycle register will be out of sync.

FIG. 15 illustrates a flowchart 1500 of SMT modeling operations of a finite state machine (FSM). Operations of this embodiment include generating graph-based data to graphically represent a circuit design 1502. Operations of this embodiment also include identifying one or more FSMs in the graph-based data of the circuit design 1504. Operations of this embodiment also include generating, for each FSM identified in the graph-based data, an SMT assertion set 1506. Operations also include modeling the SMT assert set to determine a behavior of the FSM 1508. Operations of this embodiment may also include generating a state transition graph of the modeled behavior of the FSM 1610.

FIG. 16 illustrates a flowchart 1600 of pipeline modeling operations of a finite state machine (FSM). Operations of this embodiment include generating graph-based data to graphically represent a circuit design 1602. Operations of this embodiment also include identifying one or more FSMs in the graph-based data of the circuit design 1604. Operations of this embodiment also include generating, for each FSM identified in the graph-based data, an SMT assertion set 1606. Operations also include modeling, for each of a plurality of clock cycle, the SMT assertion set to determine a number of transitions to reach a desired state 1608.

While FIGS. 15 and 16 illustrates various operations according to one or more embodiments, it is to be understood that not all of the operations depicted in FIG. 15 or 16 are necessary for other embodiments. Indeed, it is fully contemplated herein that in other embodiments of the present disclosure, the operations depicted in FIG. 15 or 16, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Any of the operations described herein may be implemented in a system that includes one or more non-transitory storage devices having stored therein, individually or in combination, instructions that when executed by circuitry to perform the operations. "Circuitry", as used in any embodiment herein, may comprise, for example, singly or in any combination, hardwired circuitry, programmable circuitry such as processors comprising one or more individual instruction processing cores, state machine circuitry, and/or firmware that stores instructions executed by programmable circuitry and/or future computing circuitry including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), application-specific integrated circuit (ASIC), programmable logic devices (PLD), digital signal processors (DSP), field programmable gate array (FPGA), logic gates, registers, semiconductor device, chips, microchips, chip sets, etc.

The storage device includes any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device. Also, it is intended that operations described herein may be distributed across a plurality of physical devices, such as processing structures at more than one different physical location.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

What is claimed:

1. A satisfiability modulo theory (SMT) modeling system, comprising:

graphical representation circuitry to generate graphical data representing a circuit design;

finite state machine (FSM) discovery circuitry to discover, based on a feedback loop of the circuit design, an FSM contained within the graphical data;

SMT assertion generation circuitry to generate an SMT assertion set of the FSM, based on the combinatorial and/or sequential logic elements associated with the FSM; and SMT modeling circuitry to determine a state transition behavior of the FSM based on one or more logical functions applied to the SMT assertion set; and pipeline modeling circuitry configured to generate a plurality of state outputs at each of a selected number (n) of clock cycles for the FSM; wherein the pipeline modeling circuitry is further configured to trace the number of transitions required to reach a desired state, based on the desired state and/or desired relationship between states associated with the SMT assertion set.

2. The system of claim 1, further comprising state transition graphing circuitry to generate a state transition graph of a plurality of state transitions of the FSM.

3. The system of claim 1, wherein the one or more logical functions include at least one of a set state function, a set control function, a reset state function, a get next step function, a step function, a state sensitivity function, and a set/reset/enable function.

4. The system of claim 1, wherein the SMT assertion set comprises at least one Boolean equation based on the combinatorial and/or sequential logic elements associated with the FSM.

5. The system of claim 1, wherein the graphical representation circuitry to generate graphical data based on a text description of the circuit design.

6. A non-transitory storage device that includes machine-readable instructions that, when executed by one or more processors, cause the one or more processors to perform operations, comprising:

generate graph-based data to graphically represent a circuit design;

identify, based on a feedback loop of the circuit design, a finite state machine (FSM) in the graph-based data of the circuit design;

generate, for the FSM identified in the graph-based data, an satisfiability modulo theory (SMT) assertion set, based on the combinatorial and/or sequential logic elements associated with the FSM; and model the SMT assert set to determine a state transition behavior of the FSM based on one or more logical functions applied to the SMT assertion set; and generate a plurality of state outputs at each of a selected number (n) of clock cycles for the FSM; and trace the number of transitions required to reach a desired state, based on the desired state and/or desired relationship between states associated with the SMT assertion set.

7. The non-transitory storage device of claim 6, wherein the machine-readable instructions that, when executed by one or more processors, cause the one or more processors to perform operations, comprising:

generate a state transition graph of a plurality of state transition behaviors of the FSM.

8. The non-transitory storage device of claim 6, wherein the one or more logical functions include at least one of a set state function, a set control function, a reset state function, a get next step function, a step function, a state sensitivity function, and a set/reset/enable function.

9. The non-transitory storage device of claim 6, wherein the SMT assertion set comprises at least one Boolean equation based on the combinatorial and/or sequential logic elements associated with the FSM.

10. The non-transitory storage device of claim 6, wherein the graphical representation circuitry to generate graphical data based on a text description of the circuit design.

11. A non-transitory storage device that includes machine-readable instructions that, when executed by one or more processors, cause the one or more processors to perform operations, comprising:

generate graph-based data to graphically represent a circuit design;

identify, based on a feedback loop of the circuit design, a finite state machine (FSM) in the graph-based data of the circuit design;

generate, for the FSM identified in the graph-based data, a satisfiability modulo theory (SMT) assertion set, based on the combinatorial and/or sequential logic elements associated with the FSM;

model, for each of a plurality of clock cycles, the SMT assert set to determine a number of transitions to reach a desired state; and generate a plurality of state outputs at each of a selected number (n) of clock cycles for the FSM; and trace the number of transitions required to reach a desired state, based on the desired state and/or desired relationship between states associated with the SMT assertion set.

12. The non-transitory storage device of claim 11, wherein the one or more logical functions include at least one of a set state function, a set control function, a reset state function, a get next step function, a step function, a state sensitivity function, and a set/reset/enable function.

13. The non-transitory storage device of claim 11, wherein the SMT assertion set comprises at least one Boolean equation based on the combinatorial and/or sequential logic elements associated with the FSM.

14. The non-transitory storage device of claim 11, wherein the graphical representation circuitry to generate graphical data based on a text description of the circuit design.

* * * * *